United States Patent
Shirouzu

(10) Patent No.: US 9,000,796 B2
(45) Date of Patent: Apr. 7, 2015

(54) ACTIVE MATRIX SUBSTRATE, DISPLAY PANEL, AND TESTING METHOD FOR ACTIVE MATRIX SUBSTRATE AND DISPLAY PANEL

(75) Inventor: Hiroshi Shirouzu, Shiga (JP)

(73) Assignee: Panasonic Corporation, Osaka (JP)

( * ) Notice: Subject to any disclaimer, the term of this patent is extended or adjusted under 35 U.S.C. 154(b) by 531 days.

(21) Appl. No.: 13/295,480

(22) Filed: Nov. 14, 2011

(65) Prior Publication Data

US 2012/0056186 A1 Mar. 8, 2012

Related U.S. Application Data

(63) Continuation of application No. PCT/JP2010/000055, filed on Jan. 6, 2010.

(51) Int. Cl.
| | |
|---|---|
| G01R 31/26 | (2014.01) |
| G09G 3/00 | (2006.01) |
| G02F 1/1362 | (2006.01) |
| H01L 27/02 | (2006.01) |
| G02F 1/1345 | (2006.01) |
| G02F 1/13 | (2006.01) |

(52) U.S. Cl.
CPC .......... *G09G 3/006* (2013.01); *G02F 1/136204* (2013.01); *H01L 27/0296* (2013.01); *G02F 1/1345* (2013.01); *G02F 1/13452* (2013.01); *G09G 2330/04* (2013.01); *G02F 1/1309* (2013.01); *G02F 2203/69* (2013.01)

(58) Field of Classification Search
CPC . G09G 3/3648; G09G 3/3655; G09G 3/3659; G09G 2330/12
See application file for complete search history.

(56) References Cited

U.S. PATENT DOCUMENTS

| | | | | |
|---|---|---|---|---|
| 5,504,348 | A | * | 4/1996 | Yoshida et al. ................. 257/59 |
| 5,798,534 | A | * | 8/1998 | Young ............................. 257/59 |
| 6,104,449 | A | | 8/2000 | Takahashi et al. |
| 7,274,345 | B2 | | 9/2007 | Imamura et al. |
| 7,453,420 | B2 | * | 11/2008 | Watanabe et al. ............... 345/55 |

(Continued)

FOREIGN PATENT DOCUMENTS

| | | |
|---|---|---|
| CN | 1551059 | 12/2004 |
| JP | 05-181157 | 7/1993 |

(Continued)

OTHER PUBLICATIONS

China Office action and Search Report, dated Dec. 20, 2013 along with an english translation thereof.

*Primary Examiner* — Minh N Tang
(74) *Attorney, Agent, or Firm* — Greenblum & Bernstein, P.L.C.

(57) ABSTRACT

An active matrix substrate including: gate lines; source lines arranged in a direction orthogonal to each of the gate lines; a gate short-circuit line to short-circuit the gate lines; a source short-circuit line to short-circuit the source lines; gate line thin film transistors each having a drain electrode being connected to the corresponding one of the gate lines, and a source electrode being connected to the gate short-circuit line; and source line thin film transistors each having a drain electrode being connected to the corresponding one of the source lines, and a source electrode being connected to the source short-circuit line, in which the gate line thin film transistors and the source line thin film transistors are of depletion-mode, and the gate electrode of each of the source line thin film transistors is connected to the gate short-circuit line.

5 Claims, 7 Drawing Sheets

(56) References Cited

U.S. PATENT DOCUMENTS

| | | |
|---|---|---|
| 7,772,766 B2 | 8/2010 | Aoki |
| 7,843,208 B2 * | 11/2010 | Kwak ................. 324/760.02 |
| 2002/0021375 A1 * | 2/2002 | Nakajima et al. ............. 349/40 |
| 2004/0257353 A1 | 12/2004 | Imamura et al. |
| 2005/0057273 A1 * | 3/2005 | Lin et al. ..................... 324/770 |
| 2006/0017672 A1 | 1/2006 | Aoki |
| 2006/0028414 A1 * | 2/2006 | Kimura et al. ................. 345/87 |
| 2007/0018680 A1 * | 1/2007 | Jeon et al. ..................... 324/770 |
| 2007/0030434 A1 * | 2/2007 | Hirabayashi et al. ......... 349/149 |
| 2007/0296652 A1 | 12/2007 | Imamura et al. |
| 2009/0147164 A1 * | 6/2009 | Toyoshima et al. ............. 349/39 |
| 2010/0264822 A1 | 10/2010 | Aoki |
| 2011/0063275 A1 | 3/2011 | Imamura et al. |

FOREIGN PATENT DOCUMENTS

| | | |
|---|---|---|
| JP | 07-249777 | 9/1995 |
| JP | 07-333275 | 12/1995 |
| JP | 09-090428 | 4/1997 |
| JP | 10-039329 | 2/1998 |
| JP | 11-142888 | 5/1999 |
| JP | 2002-189428 | 7/2002 |
| JP | 2005-093459 | 4/2005 |
| JP | 2007-310131 | 11/2007 |
| JP | 2008-282029 | 11/2008 |

* cited by examiner

US 9,000,796 B2

ACTIVE MATRIX SUBSTRATE, DISPLAY PANEL, AND TESTING METHOD FOR ACTIVE MATRIX SUBSTRATE AND DISPLAY PANEL

CROSS REFERENCE TO RELATED APPLICATION

This is a continuation application of PCT application No. PCT/JP2010/000055 filed on Jan. 6, 2010, designating the United States of America.

BACKGROUND OF THE INVENTION (1) Field of the Invention

The present invention relates to an active matrix substrate, a display panel using the substrate, and a testing method for the active matrix substrate and the display panel, and particularly relates to a protection circuit for the active matrix substrate and the display panel using the active matrix substrate.

(2) Description of the Related Art

Along with the increased demand for better display apparatus in recent years, Liquid Crystal Display (LCD) panels and organic electroluminescence (EL) display panels have been attracting attention as thin display panels with low power consumption. The display panels have two-dimensionally arranged pixels.

For example, in an active matrix organic EL display panel, thin film transistors (TFT) are provided at intersections of scanning lines and data lines. Storage capacitors, gates of driving transistors, and compensating circuits are connected to the TFTs. The TFTs are turned ON through selected scanning lines, input data signals and others are provided from the data lines to the driving transistors, the storage capacitors, and the compensating circuits. The driving transistors, storage capacitors, and the compensating circuits control brightness and timing of light emitted from the organic EL element. This configuration of the pixel driving circuit allows an active matrix organic EL display panel to have the organic EL element emit light until next scanning (selection). Consequently, even when a duty cycle increases, it does not result in decrease in display brightness.

However, the active matrix organic EL display panel has a complex pixel driving circuit configuration. Because of this, electric malfunctions such as uneven characteristics of the pixel driving circuit devices, short-circuited lines, and opened lines. In order to compensate the uneven characteristics and to improve yield at the time of manufacturing, it is necessary to perform sufficient testing on arrays of active matrix substrate during the manufacturing process, and testing on display operations of display panels after completion before mounting components to be mounted. At the time of testing, when an external measuring device and a measuring subject, that is, an active matrix substrate or a display panel are connected, or when no external measuring device is connected during the manufacturing process, there is a possibility that static electricity flows into an active matrix substrates, causing electrostatic breakdown of the pixel circuits. Patent Literature 1 (Japanese Unexamined Patent Application Publication No. H11-142888 discloses a configuration for protecting the display panel from the electrostatic breakdown at the time of manufacturing and testing an LCD.

FIG. 7 is a planar view schematically illustrating signal input terminals of the LCD apparatus according to Patent Literature 1. FIG. 7 shows an array substrate 501 on which display switching element such as a TFT (not illustrated) is bonded with a facing substrate 502. The facing substrate 502 includes a display region 503. In the array substrate 501, source lines 504 and gate lines 505 are provided as many as necessary for displaying images. Each of the source lines 504 has a testing signal voltage input terminal 506, and each of the gate lines 505 has a testing signal voltage input terminal 507. A short-circuit ring 508 made of low-resistance material such as metal is provided at the outer periphery of the array substrate 501. The short-circuit ring 508, the source lines 504, and the gate lines 505 are electrically connected via depletion-mode TFTs 509. The gate electrodes of the depletion-mode TFTs 509 are connected to the lines 510 on an arbitrary unit bases, and controlled by a gate voltage input terminal 511 on the unit basis.

With the configuration described above, during the manufacturing process of the LCD apparatus, no voltage is applied to the gate electrode of the depletion-mode TFTs 509, and all of the source lines 504, all of the gate lines 505, and the short-circuit ring 508 conduct via the depletion-mode TFT 509 which is in ON state. With this, it is possible to take measures for preventing electrostatic breakdown. When testing the LCD apparatus, for example, in the case of array testing probing array substrate for array defect, or in the case of panel lighting-up display testing probing the LCD panel before mounting components, it is necessary that probes and others contact the testing signal voltage input terminals 506 and 507 to apply individual testing signals and lighting-up signal voltages. In this case, it is necessary for all of the source lines 504 and the gate lines 505 to be electrically open to each other and with the short-circuit ring 508. Thus, negative OFF voltage is applied to the gate electrode of the depletion-mode TFT 509 from the gate voltage input terminal 511. With this, the lines are completely open, allowing highly precise testing and lighting-up display without being affected by signals from neighboring lines. When the depletion-mode TFTs 509 as ESD protecting elements are not necessary after the testing, the connection may be cut off at a cutting line 512. Alternatively, when leaving the depletion-mode TFTs 509 which is a ESD protecting element as a measure for preventing electrostatic breakdown during mounting process or after the manufacturing is complete, applying a negative OFF voltage to the gate voltage input terminal 511 at all times allows the lines to be open.

SUMMARY OF THE INVENTION

However, the conventional display apparatus and its testing method according to Patent Literature 1 has a problem that a postprocessing necessary for preventing the static electricity protection circuit from electrically affecting the display operation. The postprocessing includes disconnecting the static electricity protection circuit at the time of display operation, or providing a dedicated voltage input terminal separately to apply voltage from the terminal for turning OFF the ESD protection circuit.

In view of the problem, it is an object of the present invention to propose an active matrix substrate, and a display panel which are capable of protecting the substrate from static electricity with a simple circuit and does not need any postprocessing at the time of display operation, and testing methods for the active matrix substrate and the display panel.

In order to implement the above object, an active matrix substrate according to an aspect of the present invention includes: a substrate; a plurality of gate lines arranged on the substrate; a plurality of source lines arranged on the substrate, in a direction orthogonal to each of the plurality of gate lines; a gate short-circuit line arranged on a peripheral region of the substrate to short-circuit the plurality of gate lines; a source short-circuit line arranged on a peripheral region of the substrate to short-circuit the plurality of source lines; a plurality of gate line thin film transistors each provided for a corresponding one of the plurality of gate lines and each having a source electrode and a drain electrode, one of the source electrode and the drain electrode being connected to the corresponding one of the plurality of gate lines, and the other of the source electrode and the drain electrode being connected to the gate short-circuit line; and a plurality of source line thin film transistors each provided for a corresponding one of the plurality of source lines and each having a source electrode and a drain electrode, one of the source electrode and the drain electrode being connected to the corresponding one of the plurality of source lines, and the other of the source electrode and the drain electrode being connected to the source short-circuit line, in which the plurality of gate line thin film transistors and the plurality of source line thin film transistors are of depletion-mode, and the gate electrode of each of the plurality of source line thin film transistors is connected to the gate short-circuit line.

According to the active matrix substrate, the display panel, and the testing methods for the active matrix substrate and the display panel of the present invention, the ESD protecting TFT on the source lines is switched OFF with a simple circuit configuration. Thus, it is possible to perform operations for protection from the static electricity and display without electrically affecting the source lines. The post processing for the display operation is not necessary either.

FURTHER INFORMATION ABOUT TECHNICAL BACKGROUND TO THIS APPLICATION

The disclosure of PCT application No. PCT/JP2010/000055 filed on Jan. 6, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Figure 1:
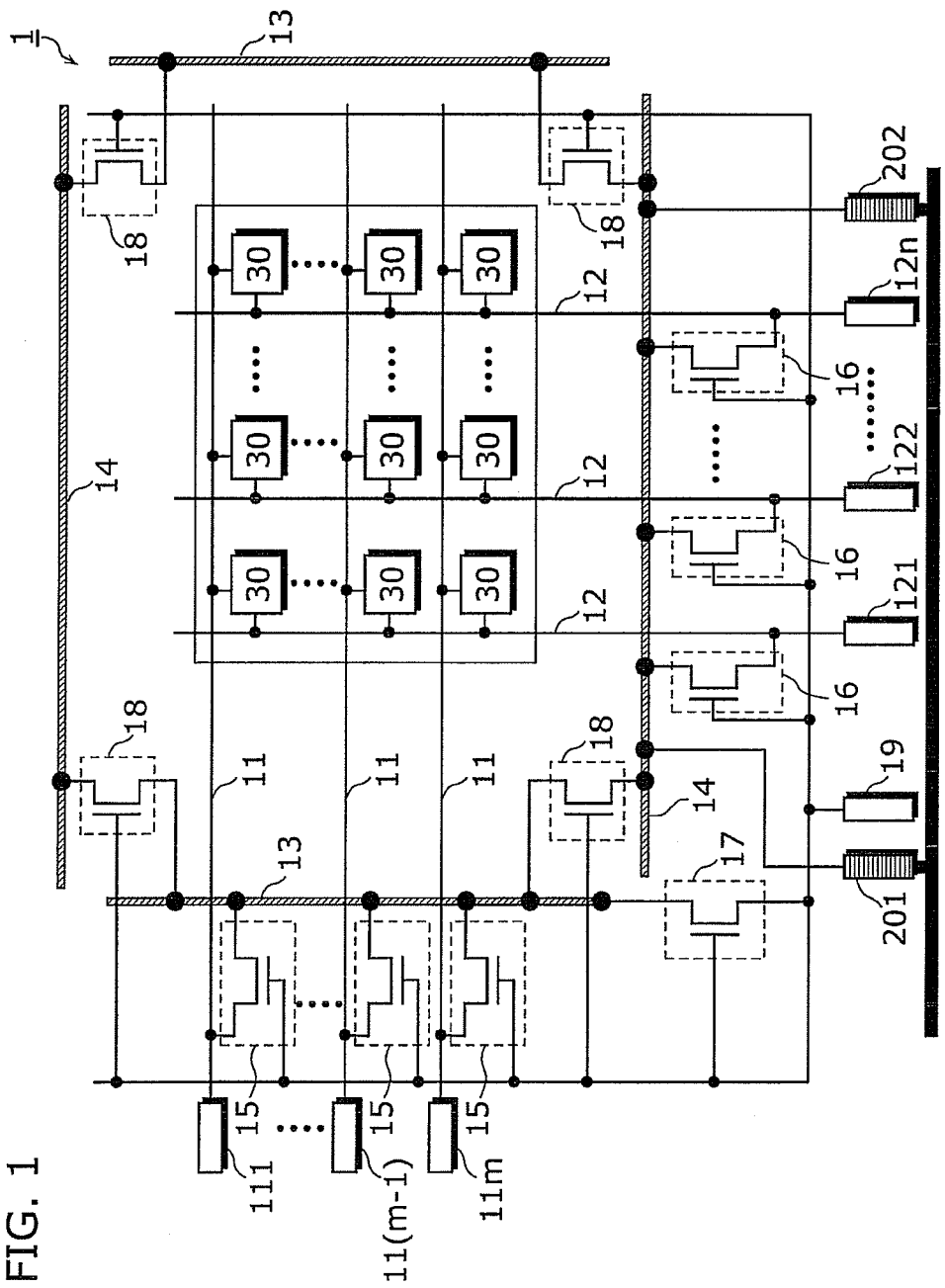
FIG. 1 is a block diagram illustrating electric configuration of a display panel according to an embodiment of the present invention.

The active matrix substrate according to an aspect of the present invention is an active matrix substrate including: a substrate; a plurality of gate lines arranged on the substrate; a plurality of source lines arranged on the substrate, in a direction orthogonal to each of the plurality of gate lines; a gate short-circuit line arranged on a peripheral region of the substrate to short-circuit the plurality of gate lines; a source short-circuit line arranged on a peripheral region of the substrate to short-circuit the plurality of source lines; a plurality of gate line thin film transistors each provided for a corresponding one of the plurality of gate lines and each having a source electrode and a drain electrode, one of the source electrode and the drain electrode being connected to the corresponding one of the plurality of gate lines, and the other of the source electrode and the drain electrode being connected to the gate short-circuit line; and a plurality of source line thin film transistors each provided for a corresponding one of the plurality of source lines and each having a source electrode and a drain electrode, one of the source electrode and the drain electrode being connected to the corresponding one of the plurality of source lines, and the other of the source electrode and the drain electrode being connected to the source short-circuit line, in which the plurality of gate line thin film transistors and the plurality of source line thin film transistors are of depletion-mode, and the gate electrode of each of the plurality of source line thin film transistors is connected to the gate short-circuit line.

According to this embodiment, the depletion-mode source line thin film transistor having the source electrode connected to the source short-circuit line, the drain electrode connected to the source lines, and the gate electrode connected to the gate short-circuit line is used as the ESD protection transistor on the source line side. In addition, the depletion-mode gate line thin film transistor having the source electrode connected to the gate short-circuit line, and the drain electrode connected to the gate line is used as the ESD protection transistor on the gate line side.

When the gate lines and the source lines are in non-display operation, the voltage of the source short-circuit line and the gate short-circuit line is normally maintained around 0 V during the manufacturing process. With this, the gate-source voltage in the source line thin film transistor is 0V, that is, the transistor is in ON state. The depletion-mode gate line thin film transistor inserted between the gate lines and the gate short-circuit line is in ON state unless a negative voltage is applied between the gate electrode and the source electrode. As such, the source lines and the gate lines conduct the source short-circuit lines and the gate short-circuit lines, respectively, and the short-circuit lines and the circuit devices connected to the short-circuit lines are protected from static electricity.

On the other hand, when the gate lines and the source lines are in display operation, a negative voltage is applied to the non-active gate lines, and a positive voltage is applied to the active gate line. Furthermore, the gate line thin film transistor remains ON unless a negative voltage is applied between the gate electrode and the source electrode. Here, a micro leakage current from the gate line which is non-active and has a negative voltage, and a micro leakage current from the gate line which is active and has a positive voltage flow in the gate short-circuit line conducting with the gate lines. However, active gate line is always one gate line, and the other gate lines are non-active. Thus, the voltage of the gate short-circuit lines is always dominantly negative voltage applied to the non-active gate lines. Consequently, the gate electrodes of the source-line TFTs usually have the negative voltage. In addition, the source electrode of the source line thin film transistor remains 0 V in the same manner as the non-display operation. Thus, a negative voltage is applied between the gate electrode and the source electrode of the source line thin film transistor, turning OFF the source line thin film transistor. Here, micro leakage current flows between the gate lines and the gate short-circuit lines. However, it does not affect the voltage level of the gate signal.

As described above, with the simple circuit configuration, it is possible to maintain ON state of the ESD protection transistors on the source line side at the time of non-display operation, and to maintain OFF state of the ESD protection transistors on the source line side without cutting the circuit or any postprocessing. Accordingly, at the time of non-display operation, it is possible to protect the pixel circuit on the active matrix substrate from static electricity, and to supply a precise testing voltage or the video signal voltage from the source lines to the pixel circuit at the time of display operation.

Furthermore, the active matrix substrate according to an aspect of the present invention has a load thin film transistor having a source electrode and a gate electrode which are short-circuited is inserted between the gate electrode of each of the plurality of source line thin film transistors and the gate short-circuit line, the load thin film transistor being for setting an electric potential of the gate short-circuit line to an electric potential of the gate electrode of each of the plurality of source line thin film transistors, and the gate electrode of each of the plurality of gate line thin film transistor is connected to the gate electrode of each of the plurality of source line thin film transistors.

According to this aspect, the load thin film transistor has a diode property; that is, flowing current only from the gate electrode of the source line thin film transistor to the gate short-circuit line. Thus, it is possible to appropriately set the electric potential of the gate short-circuit line to the gate electrode of all of the source line thin film transistors. Furthermore, the load thin film transistor allows changing the gate voltage of the source line thin film transistor and the gate line thin film transistor to any given value at the electric testing before shipment.

Furthermore, since the gate electrodes of all of the gate line thin film transistors are connected to the gate electrodes of all of the source line thin film transistors, the static electricity protection modes of the gate line thin film transistor and the source line thin film transistor are determined by the difference between the electric potential of the gate short-circuit lines and the source short-circuit lines connected to the source electrodes, respectively.

With this, when the gate line and the source line are in non-display operation, the source short-circuit line and the gate short-circuit line are maintained around 0 V during the manufacturing process. Thus, the gate-source voltage of the source line thin film transistor is 0 V, and the transistor is in ON state. In addition, the gate-source voltage of the gate line thin film transistor is also 0 V, and the transistor is in ON state. As such, the source line and the gate line conduct with the source short-circuit line and the gate short-circuit line, respectively, and the short-circuit lines and the circuit devices connected to the short-circuit lines are protected from the static electricity.

On the other hand, when the gate line and the source line are in display operation, the gate-source voltage of the gate line thin film transistor is 0 V, and the transistor is in ON state. In addition, a negative voltage is applied to the non-active gate lines, and a positive voltage is applied to the active gate line. Thus, the voltage of the gate short-circuit line is always dominantly the negative voltage applied to the non-active gate lines. Thus, the voltage of the gate electrode of the source line thin film transistor is almost always the same as the negative voltage, and the voltage of the source electrode of the source line thin film transistor is 0 V, which is the voltage at the source short-circuit line. Thus, a negative voltage is applied between the gate electrode and the source electrode of the source line thin film transistor, and the source line thin film transistor is turned OFF. In addition, here, micro leakage current flows between the gate lines and the gate short-circuit lines. However, it does not affect the voltage level of the gate signal.

As described above, with the simple circuit configuration, it is possible to maintain ON state of the ESD protection transistors on the source line side at the time of non-display operation, and to maintain OFF state of the ESD protection transistors on the source line side without cutting the circuit or any postprocessing.

Furthermore, the active matrix substrate according to an aspect of the present invention has a separating thin film transistor capable of separating an electric potential of the gate short-circuit line from an electric potential of the source short-circuit line, the separating thin film transistor having a source electrode, a drain electrode, and a gate electrode, one of the source electrode and the drain electrode being connected to the gate short-circuit line, the other of the source electrode and the drain electrode being connected to the source short-circuit line, and the gate electrode being connected to the gate electrode of each of the source line thin film transistors.

In the conventional display apparatus, one continuous short-circuit ring for protecting both the gate lines and the source lines from static electricity is provided in the peripheral region of the substrate. In contrast, according to the present invention, the gate short-circuit lines and the source short-circuit lines that are not short-circuited with each other are provided in the peripheral region of the substrate, and at the time of display operation, only the gate short-circuit lines have a negative electric potential without any postprocessing. On the other hand, it is preferable that both the gate short-circuit lines and the source short-circuit lines function as electrodes for ESD protection at the time of non-display operation. At the time of non-display operation, both the gate short-circuit line and the source short-circuit line are maintained at around 0 V, and thus they serve as electrodes for ESD protection. However, for example, when the gate short-circuit line is charged with a negative electric potential, the gate-source voltage of the gate line thin film transistor is 0 V. Thus, the gate line thin film transistor maintains ON state; however, the gate-source voltage of the source line thin film transistor is a negative voltage, and the source line thin film transistor is turned OFF. In this situation, the electric potential of the gate short-circuit line can be returned back to the electric potential of the source short-circuit line since the separating thin film transistor is in ON state. As such, it is possible to avoid the state that the source line thin film transistor is turned OFF. Furthermore, even at the time of display operation, the separating transistor remains turned ON. However, in the ON state, the voltage barely exceeds the threshold voltage. Consequently, only a weak current at an order of few μA actually flows in the transistor. Thus, at the time of display operation, the electric potential of the gate short-circuit line which is dominantly the negative voltage applied to the non-active gate lines, and the electric potential of the grounded source short-circuit line does not affect each other through the transistor.

In other words, the separating transistor is capable of maintaining the gate short-circuit lines and the source short-circuit lines electrically separate at the time of display operation and normal state of non-display operation, and adjusting the electric potential of the gate short-circuit line to the electric potential of the source short-circuit line at the time of irregular state during the non-display operation.

Furthermore, the active matrix substrate according to an aspect of the present invention in which the electric potential of the gate short-circuit line is set to a same electric potential as the electric potential of the source short-circuit line when no scanning signal voltage is supplied to the plurality of gate lines, and the electric potential of the gate short-circuit line is set to a electric potential separate from the electric potential of the source short-circuit line when a scanning signal voltage is supplied to the plurality of gate lines.

According to this aspect, with the simple circuit configuration, it is possible to turn ON the ESD protection transistor at the time of non-display operation, and to turn OFF the source line ESD protection transistor without cutting the circuit or any post processing at the time of display operation.

In addition, the display panel according to an aspect of the present invention includes the active matrix substrate; and light-emitting pixels arranged at intersections of the plurality of gate lines and the plurality of source lines in the active matrix substrate.

The configuration of the active matrix substrate according to the present invention can be applied to the display panel including light-emitting pixels provided on the active matrix substrate. At the time of non-display operation of the display panel, it is possible to protect the display panel from static electricity at the time of completion of the manufacturing process of the display panel, for example. In addition, at the time of display operation of the display panel, for example, when performing array testing of the light-emitting characteristics and the circuit device characteristics of each of the light-emitting pixels, it is possible to stop the ESD protection function, and apply the testing voltage or the video signal voltage from the source line to each of the light-emitting pixels since the gate ling short-circuit line becomes negative electric potential and the source line thin film transistor is turned OFF without any processing.

Furthermore, the display panel according to an aspect of the present invention in which the light-emitting pixels include an organic electroluminescence element.

Characteristics testing of the organic EL element and driving TFTs for current driving the organic EL element at the time of manufacturing and shipment is necessary for achieving high-quality display property. Thus, there are cases where display operation and non-display operation at the display panel level is repeatedly performed. Even in such a case, according to the display panel of the present invention, the ESD protection function can be turned ON and OFF without adding artificial process in the non-display operation and the display operation.

Furthermore, the testing method of the display panel according to an aspect of the present invention includes attempting to operate a circuit of the light-emitting pixels by applying a negative voltage to the gate electrode of each of the plurality of source line thin film transistors from the gate short-circuit line to set the source line thin film transistors to a non-conducting state; and testing a circuit element of each of the light-emitting pixels based on a result of the circuit operation attempted in the attempting.

Furthermore, in the testing method of the display panel according to an aspect of the present invention, circuit elements of the light-emitting pixels connected to the plurality of source lines and the plurality of gate lines are protected from static electricity by conducting the source line thin film transistors and the gate line thin film transistors by applying zero or positive voltage to the gate electrode of each of the plurality of source line thin film transistors and the gate electrode of each of the plurality of gate line thin film transistors.

The following describes preferable embodiment of the present invention with reference to the drawings. Note that, in the following description, the same reference numerals are assigned to the same or equivalent components in all drawings, and the overlapping description is omitted.

Embodiment

The active matrix substrate according to this embodiment includes gate lines arranged on a substrate, source lines arranged in a direction orthogonal to the gate lines, the gate short-circuit line and the source short-circuit line which are arranged at a peripheral region of the substrate, depletion-mode gate line TFTs arranged between the gate lines and the gate short-circuit line, and depletion-mode source line TFTs arranged between the source lines and the source short-circuit line, and the gate electrode of each of the source line TFTs is connected to the gate short-circuit line.

With this, with the simple circuit configuration, it is possible to maintain ON state of the gate line TFT and the source line TFT which are ESD protection transistors at the time of non-display operation, and it is also possible to maintain OFF state of the source line at the time of non-display operation without cutting the circuit and any postprocessing. Accordingly, at the time of non-display operation, it is possible to protect the pixel circuit on the active matrix substrate from static electricity, and to supply a precise testing voltage or the video signal voltage from the source lines to the pixel circuit at the time of display operation.

An embodiment of the present invention shall be described with reference to the drawings.

FIG. 1 is a block diagram illustrating electric configuration of the display panel according to an aspect of the present invention. A display panel 1 in this diagram includes an active matrix substrate and light-emitting pixels 30. In addition, the active matrix substrate includes gate lines 11, source lines 12, gate short-circuit lines 13, source short-circuit lines 14, gate-line TFTs 15, source-line TFTs 16, a load TFT 17, separating TFTs 18, testing terminal 19, grounding terminals 201 and 201, source-driver terminals 121 to 12n, and gate-driver terminals 111 to 11m.

The light-emitting pixels 30 are arranged at intersections of the gate lines 11 and the source lines 12 on the active matrix substrate, and the light-emitting pixels 30 as a whole compose an m-line×n-column matrix. Each of the light-emitting pixels 30 includes: a selection transistor having a gate electrode connected to the gate line 11, and a drain electrode connected to the source line 12; a driving transistor having a gate electrode connected to the source electrode of the selection transistor; and an organic EL element having an anode connected to the source electrode of the driving transistor. With this configuration, an testing voltage or a video signal voltage is supplied from the source lines 12 to the light emitting pixels 30 connected to the gate lines 11 to which gate signals with positive voltage are applied, causing the organic EL element emit light.

The active matrix substrate according to an embodiment of the present invention differs from the conventional display apparatus in that the short-circuit ring for ESD protection is not connected in one, but separately arranged as the gate short-circuit lines and the source short-circuit lines. Furthermore, the active matrix substrate differs from the conventional technology in that the electric potential of the gate electrode of the source-line TFTs 16 which is the ESD protection transistor is set at the electric potential of the gate short-circuit lines. The following shall describe components of the active matrix substrate.

M gate lines 11 are arranged in parallel on the substrate, and each of the gate lines 11 is connected to a corresponding one of gate driver terminals 111 to 11*m*, and a light-emitting pixel 30. With this, the gate lines 11 are capable of supplying timing for writing testing voltage or video signal voltage to each of the light-emitting pixels 30 by supplying a positive gate signal voltage (for example, +10 V) to light-emitting pixels 30 (activating) in one pixel row. The gate lines 11 are also capable of supplying timing for not writing testing voltage or video signal voltage to each of the light-emitting pixels 30 by supplying a negative gate signal voltage (for example, −6.5 V) to light-emitting pixels 30 (inactivating) in one pixel row. Here, the gate driver and array tester connected to the gate-driver terminal 111 to 11*m* are circuits supplying the gate signal voltage to the gate lines 11.

Note that, in the active matrix substrate during the manufacturing process of the display panel 1, the gate lines 11 may not be connected to the light-emitting pixels 30.

N source lines 12 are arranged in parallel on the substrate, and are data lines arranged orthogonal to the gate lines 11; each of the source lines 12 is connected to a corresponding one of the source driver terminals 121 to 12*n*, and a light-emitting pixel 30. With this configuration, the source lines 12 are capable of supplying testing voltage or video signal voltage (for example, 0 V or more) to an active row of the light-emitting pixels. Here, the source drivers and array testers connected to the source driver terminals 121 to 12*n* are circuits supplying the video signal voltage or the testing voltage to the source lines 12.

Note that, in the active matrix substrate during the manufacturing process of the display panel 1, the source lines 12 may not be connected to the light-emitting pixels 30.

The gate short-circuit lines 13 capable of short-circuiting all of the gate lines 11 are arranged in a peripheral region of the substrate, and are connected to the gate lines 11 through the gate-line TFTs 15. For example, when the static electricity flows in from the gate driver terminals 111 to 11*m*, conducting gate-line TFTs 15 can release the static electricity to the gate short-circuit lines 13. With this, the gate lines 11 and the light-emitting pixels 30 connected to the gate lines 11 can be protected from electrostatic breakdown. The gate short-circuit lines 13 are made of, for example, low-resistance material such as metal.

The source short-circuit lines 14 capable of short-circuiting all of the source lines 12 are arranged in the peripheral region of the substrate, and are connected to the source lines 12 through the source-line TFTs 16. For example, when static electricity flows in from the source driver terminals 121 to 12*n*, conducting source-line TFTs 16 can release the static electricity to the source short-circuit lines 14. With this, the source lines 12 and the light-emitting pixels connected to the source lines 12 can be protected from electrostatic breakdown. The source short-circuit lines 14 are made of, for example, low-resistance material such as metal.

Note that, the source short-circuit lines 14 and the gate short-circuit lines 13 are not connected directly. In addition, the source short-circuit lines 14 are grounded through the grounding terminal 201 and 202.

Each of the gate-line TFTs 15 is a depletion-mode gate-line thin film transistor provided for each of the gate lines 11, and is capable of serving as an ESD protection transistor. In the gate-line TFT 15, one of a source electrode and a drain electrode is connected to the gate line 11, and the other of the source electrode and the drain electrode is connected to the gate short-circuit line 13. In addition, the gate electrodes of the gate-line TFTs 15 are connected to the gate electrodes of the source-line TFTs 16, and are connected to the gate short-circuit lines 13 through the load TFT 17. Thus, the gate-line TFTs 15 are in ON state when the gate-source voltage is approximately 0 V or a positive voltage, and are in OFF state when the gate-source voltage is equal to a predetermined negative voltage or less. Here, with the connection described above, the gate-source voltage of the gate-line TFTs 15 is set depending on the electric potential of the gate short-circuit lines 13. Note that, the gate-line TFTs 15 are, for example, N-type TFTs.

Each of the source-line TFTs 16 is a depletion-mode source-line thin film transistor provided for each of the source line 12, and is capable of serving as an ESD protection transistor. In the source-line TFT 16, one of a source electrode and a drain electrode is connected to the source line 12, and the other of the source electrode and the drain electrode is connected to the source short-circuit line 14. Furthermore, the gate electrodes of the source-line TFTs 16 are connected to the gate short-circuit lines 13 through the load TFT 17. Thus, the source-line TFTs 16 are in ON state when the gate-source voltage is approximately 0 V or a positive voltage, and are in OFF state when the gate-source voltage is equal to a negative voltage or less. Here, with the connection described above, the gate-source voltage of the source-line TFTs 16 is determined based on the potential difference between the gate short-circuit lines 13 and the source short-circuit lines 14. Note that, the source-line TFTs 16 are, for example, N-type TFTs.

The load TFT 17 is a load thin film transistor in which a source electrode and a gate electrode are short-circuited, the source electrode is connected to the gate electrodes of all of the source-line TFTs 16, and a drain electrode is connected to the gate short-circuit line 13. The load TFT 17 is a load thin film transistor with a diode property, that is, only a current flows from the gate electrodes of the source-line TFTs 16 to the gate short-circuit lines 13, and is for setting the electric potential of the gate short-circuit lines 13 at the gate electrodes of the source-line TFTs 16. Furthermore, the load TFT 17 allows arbitrarily changing the gate voltages of the source-line TFTs 16 and the gate-line TFTs 15 at the time of electric testing before shipment. Note that, the load TFT 17 may be an enhancement-type TFT or a depletion-mode TFT.

The separating TFT 18 has one of a source electrode and a drain electrode connected to the gate short-circuit line 13, and the other of the source electrode and the drain electrode connected to the source short-circuit line 14, and a gate electrode connected to the gate electrodes of the source-line TFTs 16.

At the time of non-display operation, the voltages of the gate short-circuit lines 13 and the source short-circuit lines 14 are maintained around 0 V. Thus, both of the short-circuit lines function as ESD protection electrode. However, when the gate short-circuit line 13 is charged with negative electric potential at the time of emergency, the gate-line TFTs 15 remain turned ON since the gate-source voltage of the gate-line TFTs 15 is 0V. However, the source-line TFTs 16 are turned OFF since the gate-source voltage of the source-line TFTs 16 becomes a negative voltage. In this situation, the separating thin film transistor being turned ON allows setting the electric potential of the gate short-circuit lines 13 to the electric potential of the source short-circuit lines 14. With this, it is possible to avoid the source-line TFTs 16 being turned OFF at the time of non-display operation.

In addition, even at the time of display operation, the separating TFTs 18 remain turned ON. Note that the ON state actually represent a state in which the voltage slightly exceeds the threshold voltage; in other words, only a weak current in an order of a few μA flows in the separating TFTs 18. Thus, at the time of display operation, the electric potential of the gate short-circuit line 13 in which a negative voltage applied to the non-active gate lines is dominant, and the electric potential of the grounded source short-circuit lines 14 are not affected by the transistors.

In other words, the separating TFT 18 is capable of maintaining the gate short-circuit lines 13 and the source short-circuit lines 14 to be electrically separate at the time of display operation and in a normal state of non-display operation, and is capable of adjusting the electric potential of the gate short-circuit lines 13 to the electric potential of the source short-circuit lines 14 in an abnormal state of the non-display operation. Note that, the separating TFTs 18 may be an enhancement-type TFT or a depletion-mode TFT.

The testing terminal 19 is connected to the gate electrodes of the gate-line TFTs 15 and the gate electrodes of the source-line TFTs 16. By applying a predetermined negative voltage to the testing terminal 19 turns OFF all of the gate-line TFTs 15 and all of the source-line TFTs 16, allowing a test on electric characteristics of circuit elements composing the light-emitting pixels 30.

Next, the following shall describe circuit operation of the display panel 1 and the active matrix substrate at the time of non-display operations. Here, the non-display operation refers to a period in which no testing voltage or video signal voltage is supplied to the source line for array testing and light-emitting tests during a manufacturing process of the active matrix substrate and the light-emitting panels.

Figure 2:
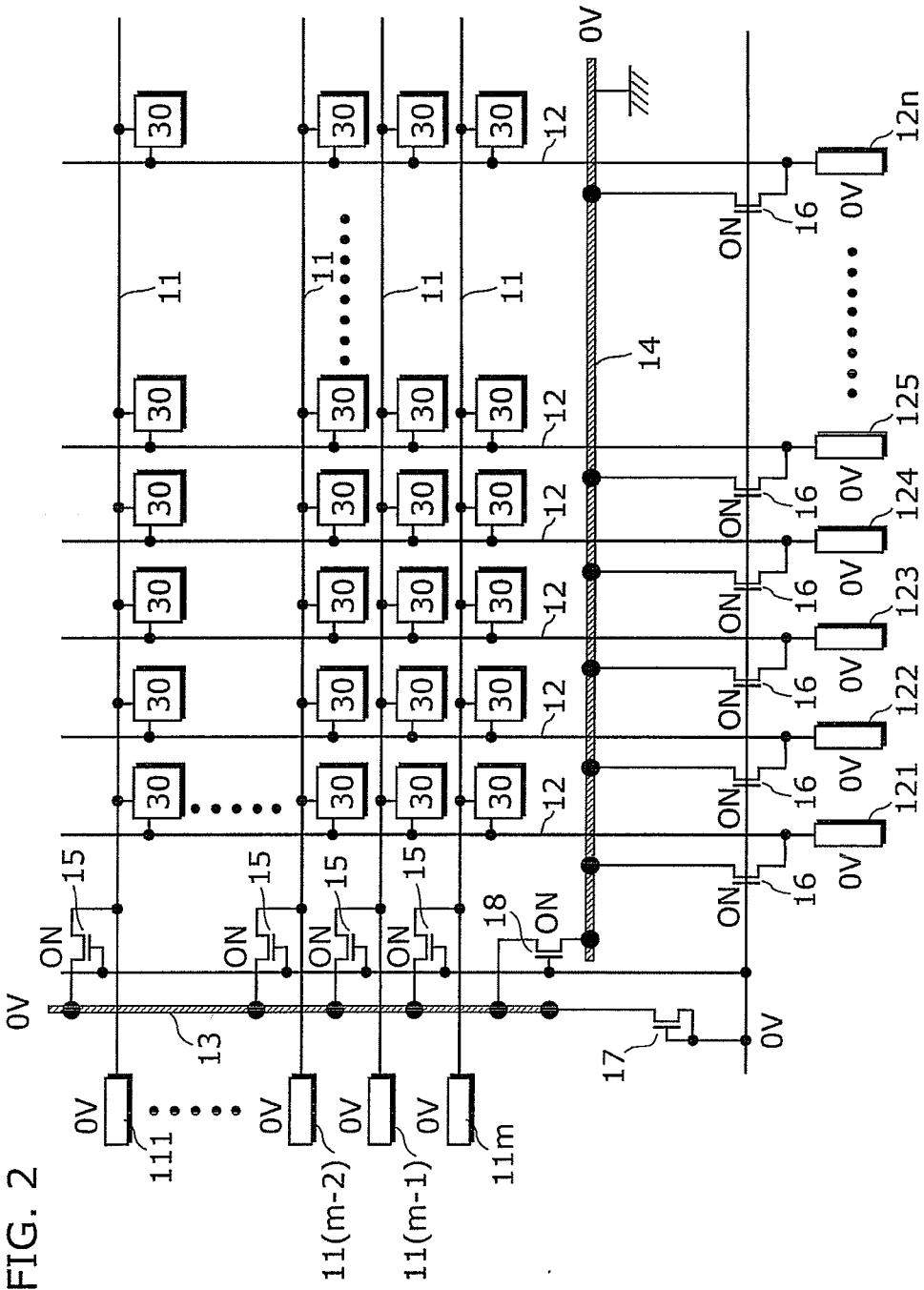
FIG. 2 is a block diagram illustrating an example of the circuit operations of the display panel at the time of non-display operation according to an embodiment of the present invention.

FIG. 2 is a block diagram illustrating an example of the circuit operation of the display panel at the time of non-display operation according to the embodiment of the present invention. At the time of non-display operation, no testing voltage, video signal voltage, for example, is supplied to gate driver terminals 111 ..., 11(m−2), 11(m−1), and 11m, and the source driver terminals 121, 122, 123, 124, 125 ..., and 12n. In addition, the source short-circuit lines 14 are grounded via the grounding terminals 201 and 202, and the gate short-circuit lines 13 are also maintained around 0 V during the manufacturing process. Furthermore, the source electric potential of the separating TFTs 18 is the electric potential of the gate short-circuit lines 13, and the gate electric potential of the separating TFT 18 is set at the electric potential of the gate short-circuit lines 13 by the load TFT 17. More specifically, the gate-source voltage of the separating TFT 18 is 0 V, and when the separating TFT 18 is the depletion-mode, the separating TFT 18 is in ON state, and a weak current flows. As described above, at the time of non-display operation, the gate short-circuit lines 13 and the source short-circuit lines 14 are at the ground potential (0 V). With this, all of the source-line TFTs 16 has the electric potential of the gate short-circuit lines 13 through the load TFT 17, has the source potential at the electric potential of the source short-circuit lines 14, and the gate-source voltage is 0 V; that is, all of the source-line TFTs 16 are in ON state. Furthermore, all of the gate-line TFTs 15 have the gate potential of the gate short-circuit lines 13 through the load TFT 17, and the source potential of the gate short-circuit lines 13, and the gate-source voltage is 0 V; that is, all of the gate line TFTs 15 are in ON state.

Note that, when the separating TFT 18 is of enhancement type, it is in OFF state at a low electric potential; however, a current flows by the IV characteristics of the TFT when charge carriers flow in and the voltage is a few dozens of volts, without increasing voltage, thereby preventing electrostatic breakdown.

As such, all of the gate lines 11 and the gate short-circuit lines 13 conduct through the gate-line TFTs 15, and all of the source lines 12 and the source short-circuit lines 14 conduct with each other through the source-line TFTs 16. This protects the active matrix substrate and the display panel 1 according to this embodiment from static electricity. Further description is made with reference to FIG. 3.

Figure 3:
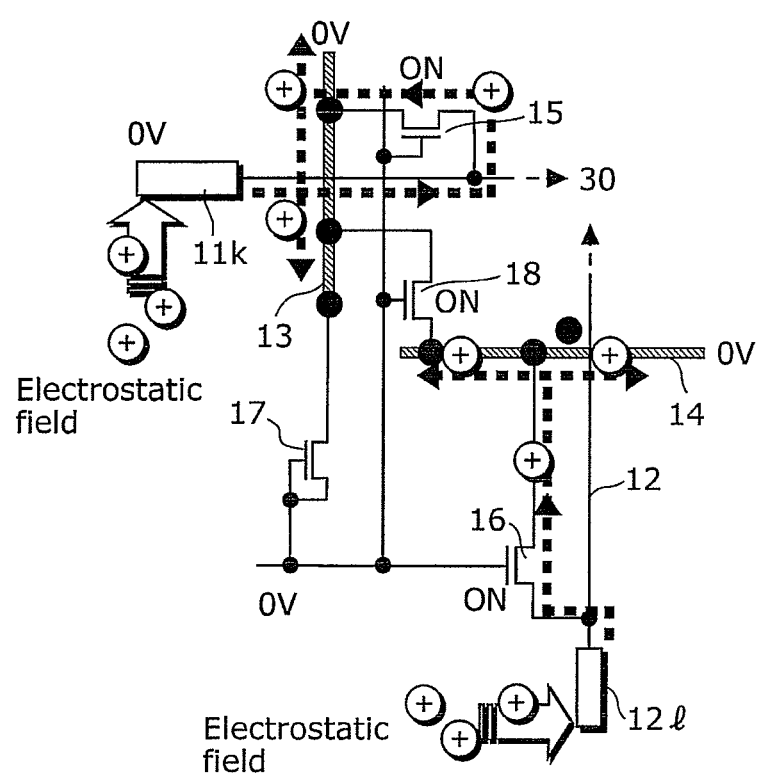
FIG. 3 is a circuit diagram illustrating the ESD protection function at the time of non-display operation according to an embodiment of the present invention.

FIG. 3 is a circuit diagram illustrating the ESD protection function at the time of non-display operation according to the embodiment of the present invention. FIG. 3 only illustrates part of the active matrix substrate, that is, the gate line 11 in row k, one column of the source lines 12, and elements connected to them. In the manufacturing process of the active matrix substrate and the display panel 1, the electric charge generated by the electrostatic field in space and external device flows through the gate driver terminal 11k and the source driver terminal 12l. Here, by applying a surge voltage by the electric charges flown in from the gate driver terminal 11k, the drain voltage of the gate-line TFTs 15 surges, reaching the protective operation start voltage. Subsequently, the gate-line TFTs 15 becomes low-resistance state, and the electric charges flown in from the gate driver terminal 11k is released to the gate short-circuit lines 13 from the gate lines 11 through the gate-line TFTs 15. Furthermore, the electric charge flown in from the source driver terminal 12l also escapes from the source lines 12 to the source short-circuit lines 14 through the source-line TFTs 16. With this, the potential difference caused by static electricity is not generated in the active matrix substrate and the light-emitting panel. Thus, the gate lines 11, the source lines 12, and the light emitting pixels connected to the lines are protected from the electrostatic breakdown.

Next, the following shall describe circuit operation of the display panel 1 and the active matrix substrate at the time of display operations. Here, the display operation refers to a period of time when a testing voltage of a video signal voltage is supplied to any of the source lines for array testing and the light-emitting operation, after the manufacturing process or completion of the active matrix substrate and the light-emitting panel.

Figure 4:
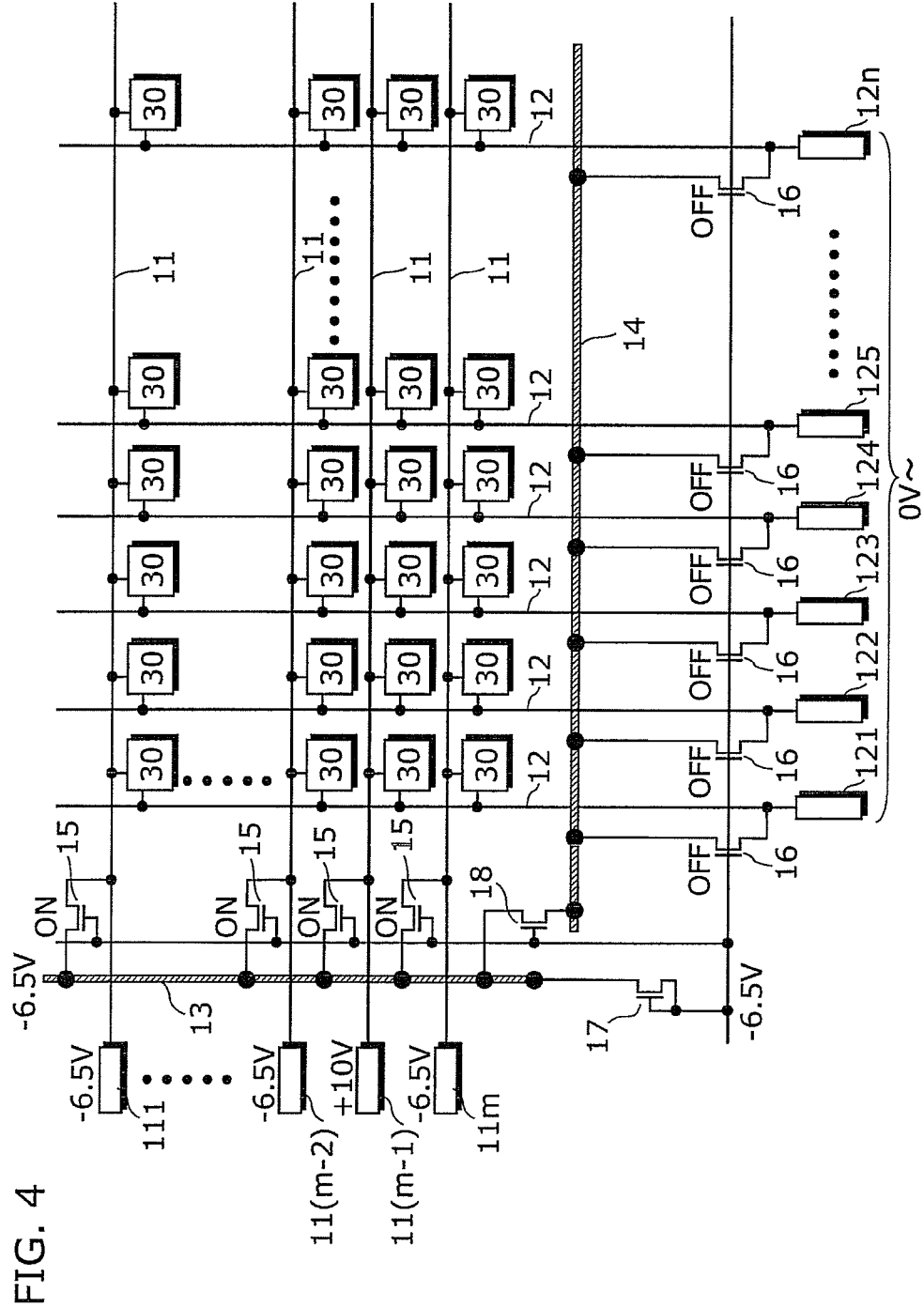
FIG. 4 is a block diagram illustrating an example of the circuit operations at the time of display operation according to an embodiment of the present invention.

FIG. 4 is a block diagram illustrating an example of the circuit operation of the display panel at the time of display operation according to the embodiment of the present invention.

At the time of display operation, only one pixel row is active, and the other pixel rows remain non-active, displaying video signals for the one pixel row. Subsequently, active pixel rows are sequentially scanned, and display operation is performed by completing scanning of all of the pixel rows within one frame period. More specifically, the gate signal voltage for controlling conducting state and non-conducting state of the selection transistor of the light-emitting pixels 30 to the gate driver terminals 111 to 11m. For example, in FIG. 4, each light-emitting pixel 30 in the pixel row is activated by supplying a positive gate signal voltage (for example, +10 V) to row (m−2) of the gate lines 11. In addition, each light-emitting pixel 30 in the pixel rows other than row (m−2) remains non-active by supplying a negative gate signal voltage (for example, −6.5 V) to all of the rows other than the row (m−2) of the gate lines 11.

Here, the electric potential of the gate short-circuit lines 13 at the time of display operation shall be described. In the display panel circuit in FIG. 4, all of the gate-line TFTs 15 has the gate potential equal to the electric potential of the gate short-circuit lines 13 through the load TFT 17, and has the source potential equal to the electric potential of the gate short-circuit lines 13, and 0 V of a gate-source voltage. Thus, all of the gate-line TFTs 15 are in ON state. In addition, the gate signal voltage supplied to the gate driver terminals 111 to 11m is applied to the drain electrodes of the gate-line TFTs 15. Accordingly, a micro drain current according to the gate signal voltage flows between all of the gate lines 11 and the gate short-circuit lines 13. Here, the electric potential of the gate short-circuit lines 13 is determined by the sum of the micro drain current. Here, the positive gate signal voltage (for example, +10 V) is applied to one gate line 11, and the negative gate signal voltage (for example, −6.5 V) is applied to the other gate lines 11. Thus, the electric potential of the gate short-circuit lines 13 is the negative gate signal voltage (for example, −6.5 V). For example, in the case of HDTV broadcast, the pixel line count m is 1080, and as described above, the electric potential of the gate short-circuit lines 13 is determined by the negative gate signal voltage. Note that, in the display operation, there is a case in which all of the gate-line TFTs 15 are in ON state, and the micro drain current flows in all of the gate-line TFTs 15. However, the micro drain current is 1 μA or less at the maximum, and thus it is not necessary to consider the variation in the gate signal voltage due to the micro drain current.

Here, the electric potential of the source short-circuit lines 14 at the time of display operation shall be described. Though not illustrated in FIG. 4, the source short-circuit lines 14 are grounded through the grounding terminals 201 and 202. Even if the separating TFT 18 is turned ON, the ON state is a state in which the voltage slightly exceeds the threshold voltage. Actually, only a weak current at an order of a few μA flows in the separating TFT 18. Thus, at the time of display operation, the electric potential of the gate short-circuit line 13 in which a negative voltage applied to the non-active gate lines is dominant, and the electric potential of the grounded source short-circuit lines 14 are not affected by the transistors. Thus, the source short-circuit lines 14 holds grounding potential (0 V) in the same manner as the non-display operation, without affected by the electric potential of the gate short-circuit lines 13.

In consideration of the electric potentials of the gate short-circuit lines 13 and the source short-circuit lines 14, all of the source-line TFTs 16 has the gate potential equal to the electric potential of the gate short-circuit lines 13 (for example, −6.5 V) through the load TFT 17, and has the source potential equal to the source short-circuit lines 14 (0 V), and the gate-source voltage is negative (for example, −6.5 V). Thus, all of the source-line TFTs 16 are in OFF state.

As such, all of the gate lines 11 and the gate short-circuit lines 13 conduct with each other through the gate-line TFTs 15, and all of the source lines 12 and the source short-circuit lines 14 does not conduct with each other through the source-line TFTs 16. In this state, at the time of display operation, the active matrix substrate and the display panel 1 according to this embodiment performs a precise display operation at the time of display operation shall be described with reference to FIG. 5.

Figure 5:
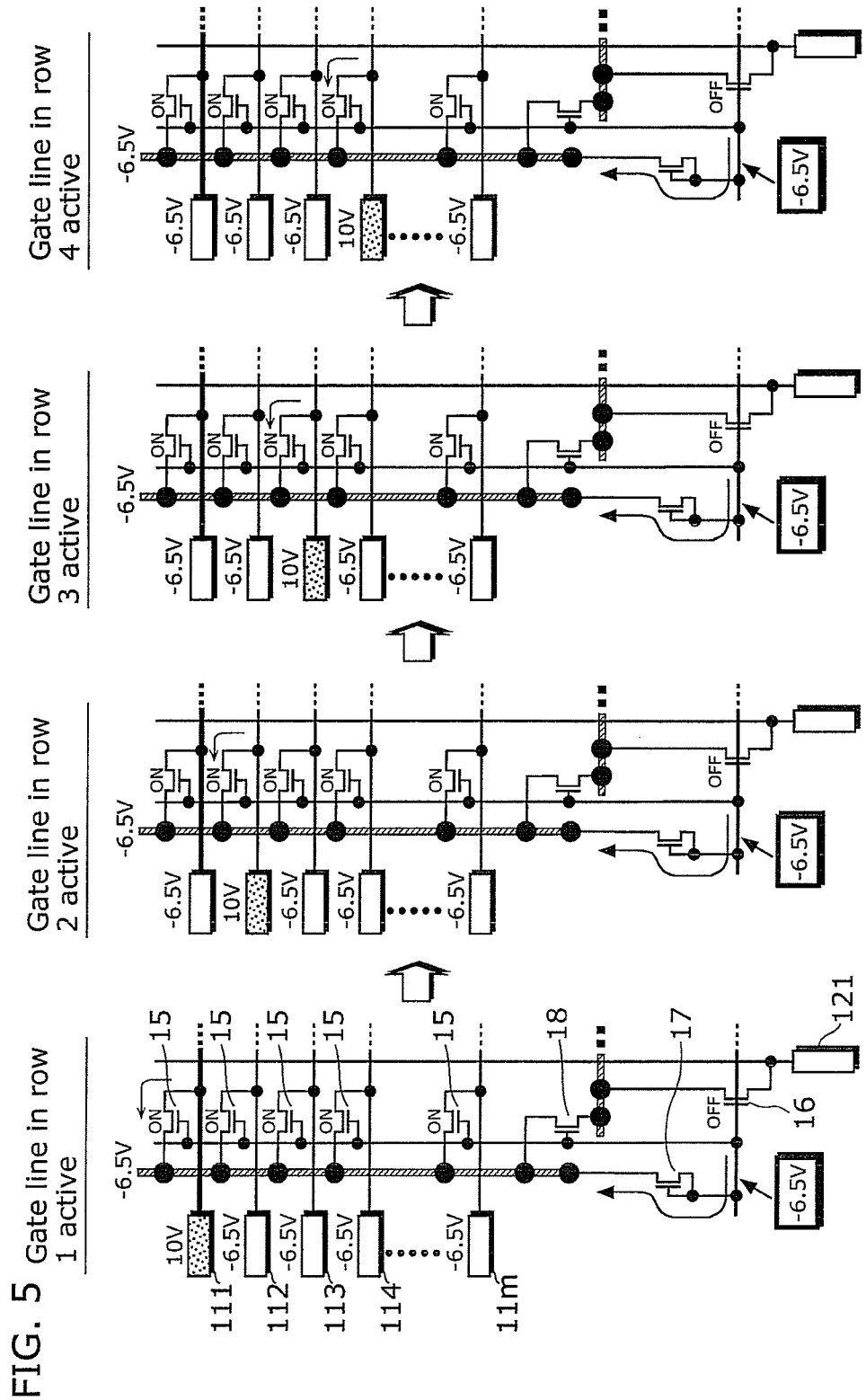
FIG. 5 is a circuit transition diagram of line scanning at the time of display operation according to an embodiment of the present invention.

FIG. 5 is a circuit transition diagram regarding row scanning at the time of display operation according to the embodiment of the present invention. FIG. 5 illustrates a circuit state of the active matrix substrate when the gate lines 11 in rows 1 to 4 are sequentially activated through the gate driver terminal 111 to 114. Note that the illustration on the source line 12 side is simplified; only illustrating one column.

First, when the gate line 11 in row 1 is active, a micro drain current according to a positive gate signal voltage (for example, +10 V) flows from the gate line 11 in row 1 to the gate short-circuit line 13. On the other hand, a micro drain current according to the negative gate signal voltage (for example −6.5 V) flows to the gate-line TFTs 15 connected to the gate lines 11 in row 2 or later. In such a voltage state of the gate lines 11, as described above, the electric potential of the gate short-circuit lines 13 is approximately equal to the negative gate signal voltage (for example, −6.5 V). With this, current flows into the gate short-circuit lines 13 through the load TFT 17 from the gate electrodes of the gate-line TFTs 15 and the gate electrodes of the source-line TFTs 16. As a result, in a constant state, the gate electrodes of the gate-line TFTs 15 and the gate electrodes of the source-line TFTs 16 are also at the negative gate signal voltage (for example, −6.5 V). Accordingly, all of the source-line TFTs 16 are in OFF state.

First, when the gate line 11 in row 2 is active, a micro drain current according to a positive gate signal voltage (for example, +10 V) flows from the gate line 11 in row 2 to the gate short-circuit line 13. Meanwhile, a micro drain current according to a negative gate signal voltage (for example, −6.5 V) flows into the gate-line TFTs 15 connected to the rest of the gate lines 11. Even if the active gate line 11 is switched, in this voltage status of the gate lines 11, the electric potential of the gate short-circuit lines 13 does not change, usually maintaining a negative gate signal voltage (for example, −6.5 V). In this case, in the same manner as the case of the active gate line 11 in row 1, all of the source-line TFTs 16 are in OFF state.

Subsequently, the active gate line 11 is sequentially switched to row 3, row 4 . . . , and row m. However, during the row scanning period, the gate short-circuit lines 13 always maintain a negative gate signal voltage (for example, −6.5 V). Thus, all of the source-line TFTs 16 always maintain OFF state during this period. Thus, in this period, a testing voltage or the video signal voltage to be written on the gate electrode of the driving transistors of the light-emitting pixels 30 is precisely supplied from the source driver terminals 121 to 12n.

Thus, at the time of display operation, it is possible to test the circuit operation of the light-emitting pixels 30 by applying a negative voltage to the gate electrodes of the all of the source-line TFTs 16 from the gate short-circuit lines 13 to put all of the source-line TFTs 16 in non-conducting state, and test the circuit device of the light-emitting pixels 30 by the result of the circuit operation.

On the other hand, at the time of non-display operation, it is possible to protect the circuit device of the light-emitting pixels 30 connected to the source lines 12 and the gate lines 11 from static electricity by applying 0 or positive voltage to the gate electrodes of all of the source-line TFTs 16 and the gate electrodes of the all of the gate-line TFTs 15 from the gate short-circuit lines 13, thereby putting all of the source-line TFTs 16 and all of the gate-line TFTs 15 in conducting state. Thus allows the circuit devices of the light-emitting pixels 30 connected to the source lines 12 and the gate lines 11 from static electricity.

As described above, according to this embodiment, the depletion-mode source-line TFTs 16 provided between the source short-circuit lines 14 and the source lines 12, and has the gate electrodes connected to the gate short-circuit line 13 through the load TFT 17 is used as an ESD protection transistor on the source line side. In addition, the depletion-mode gate-line TFTs 15 provided between the gate short-circuit lines 13 and the gate lines 11 and has the gate electrodes connected to the gate short-circuit lines 13 through the load TFT 17 are used as the ESD protection transistors on the gate line side.

With this configuration, the source-line TFTs 16 are in ON state when the gate lines 11 and the source lines 12 are in non-display operation. The gate-line TFTs 15 are also in ON state. Thus, the source lines 12 and the gate lines 11 conduct with the source short-circuit lines 14 and the gate short-circuit lines 13, respectively, and the lines and the circuit devices connected to the lines are protected from static electricity.

On the other hand, when the gate lines 11 and the source lines 12 are in display operation, a negative voltage is applied to the non-active gate lines 11, and a positive voltage is applied to the active gate lines 11. Here, in the gate short-circuit lines 13 maintaining conductive state with the gate lines 11, a micro leakage current from the non-active gate lines 11 with a negative voltage and a micro leakage current from the active gate line 11 with a positive voltage flow. However, only one gate line is always active, and the other gate lines are non-active. Thus, the voltage of the gate short-circuit lines 13 is always dominantly negative voltage applied to the non-active gate lines. Consequently, the gate electrodes of the source-line TFTs 16 usually have the negative voltage. Furthermore, the voltage at the source electrodes of the source-line TFTs 16 is 0 V. Thus, the source-line TFTs 16 are in OFF state. Here, micro leakage current flows between the gate lines and the gate short-circuit lines 13. However, it does not affect the voltage level of the gate signal.

As described above, with the simple circuit configuration, it is possible to maintain ON state of the ESD protection transistors on the gate line side and the source line side at the time of non-display operation, and to maintain OFF state of the ESD protection transistors on the source line side without cutting the circuit or any postprocessing at the time of display operation. Accordingly, at the time of non-display operation, it is possible to protect the pixel circuit on the active matrix substrate from static electricity, and to supply a precise testing voltage or the video signal voltage from the source lines to the pixel circuit and others at the time of display operation.

Although only some exemplary embodiments of the active matrix substrate, display panel, and testing method thereof according to the present invention have been described in detail above, those skilled in the art will readily appreciate that many modifications are possible in the exemplary embodiments without materially departing from the novel teachings and advantages of this invention. Accordingly, all such modifications and appliances in which the active matrix substrate and the display panel according to the present invention are included are intended to be included within the scope of this invention.

For example, an aspect of the present invention has been described as the display panel 1 including light-emitting pixels 30 arranged in a matrix. However, an active matrix substrate during the manufacturing process in which no light-emitting pixels 30 is formed can achieve the same effect.

Furthermore, in the embodiment described above, N-type transistor which is turned ON when the voltage level of the gate electrode of the TFTs is high. However, an active matrix substrate, a display panel, and testing method thereof using P-type transistors with the polarity of the gate lines reversed can achieve the same effect as described in the embodiments.

Figure 6:
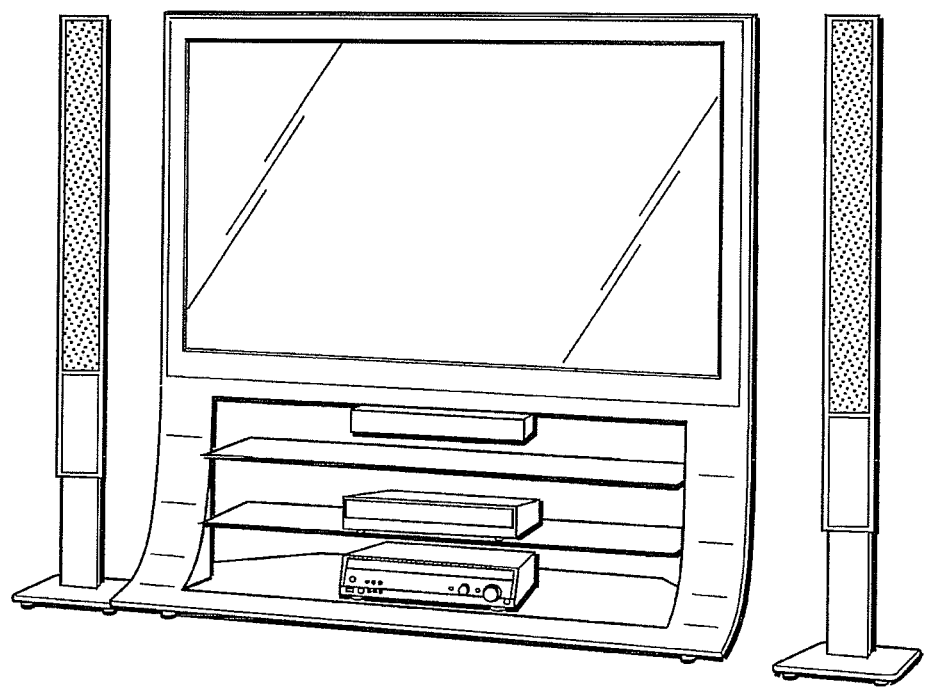
FIG. 6 is an external view of a thin flat TV which includes the display panel according to the present invention.
Figure 7:
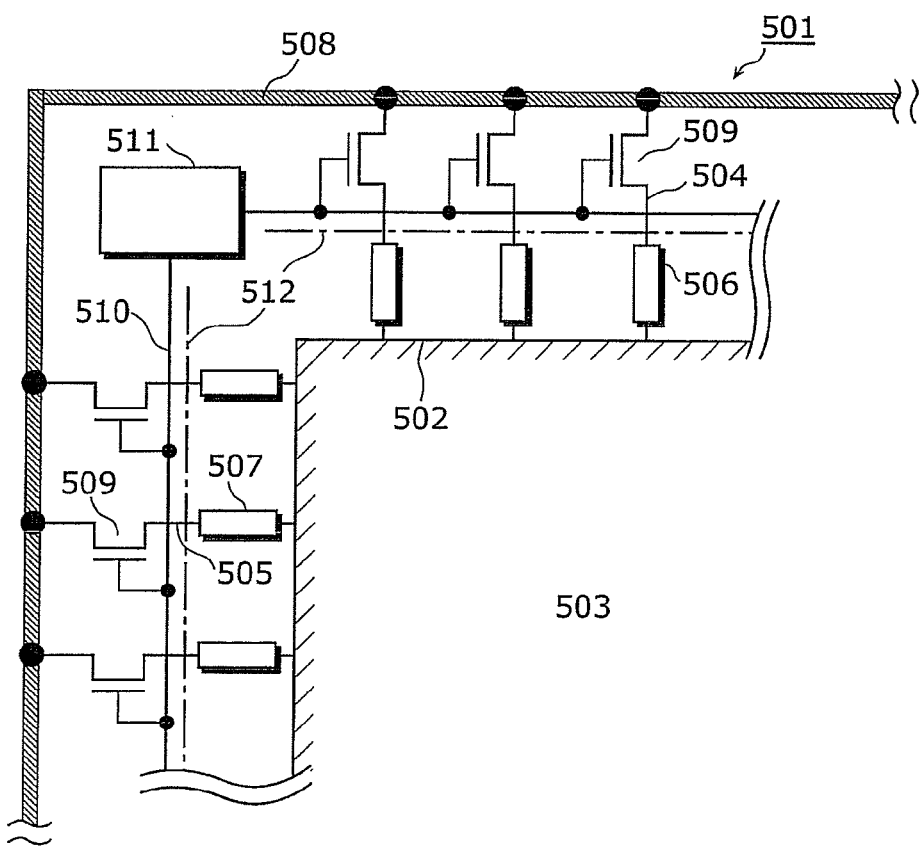
FIG. 7 is a planar view schematically illustrating signal input terminals of the LCD apparatus according to Patent Literature 1.

Furthermore, for example, the active matrix substrate, the display panel, and the testing method thereof are embedded in the thin flat TV illustrated in FIG. 6. Embedding the active matrix substrate or the display panel according to the present invention allows implementation of a thin flat TV with a static electricity protection circuit function and does not require postprocessing at the time of display operation.

INDUSTRIAL APPLICABILITY

The active matrix substrate, the display panel, and the testing methods thereof according to the present invention is useful for an active matrix organic EL flat panel display which changes brightness by controlling intensity of light emitted from the light-emitting pixels by a pixel signal current according to the display gradation.

What is claimed is:

1. An active matrix substrate, comprising:
   a substrate;
   a plurality of gate lines arranged on the substrate:
   a plurality of source lines arranged on the substrate, in a direction orthogonal to each of the plurality of gate lines;
   a gate short-circuit line arranged on a peripheral region of the substrate to short-circuit the plurality of gate lines;
   a source short-circuit line arranged on a peripheral region of the substrate to short-circuit the plurality of source lines;
   a plurality of gate line thin film transistors each provided for a corresponding one of the plurality of gate lines and each having a source electrode, a drain electrode, and a gate electrode, one of the source electrode and the drain electrode being connected to the corresponding one of the plurality of gate lines, and an other of the source electrode and the drain electrode being connected to the gate short-circuit line; and
   a plurality of source line thin film transistors each provided for a corresponding one of the plurality of source lines and each having a source electrode, a drain electrode, and a gate electrode, one of the source electrode and the drain electrode being connected to the corresponding one of the plurality of source lines, and an other of the source electrode and the drain electrode being connected to the source short-circuit line,
   wherein the plurality of gate line thin film transistors and the plurality of source line thin film transistors are of depletion-mode,
   the gate electrode of each of the plurality of source line thin film transistors is connected to the gate short-circuit line,
   a load thin film transistor having a source electrode and a gate electrode which are short-circuited is inserted between the gate electrode of each of the plurality of source line thin film transistors and the gate short-circuit line, the load thin film transistor being for setting an electric potential of the gate short-circuit line to an electric potential of the gate electrode of each of the plurality of source line thin film transistors, and
   the gate electrode of each of the plurality of gate line thin film transistor is connected to the gate electrode of each of the plurality of source line thin film transistors.

2. An active matrix substrate, comprising:
   a substrate;
   a plurality of gate lines arranged on the substrate;
   a plurality of source lines arranged on the substrate, in a direction orthogonal to each of the plurality of gate lines;
   a gate short-circuit line arranged on a peripheral region of the substrate to short-circuit the plurality of gate lines;
   a source short-circuit line arranged on a peripheral region of the substrate to short-circuit the plurality of source lines;
   a plurality of gate line thin film transistors each provided for a corresponding one of the plurality of gate lines and each having a source electrode and a drain electrode, one of the source electrode and the drain electrode being connected to the corresponding one of the plurality of gate lines, and an other of the source electrode and the drain electrode being connected to the gate short-circuit line;

a plurality of source line thin film transistors each provided for a corresponding one of the plurality of source lines and each having a source electrode, a drain electrode, and a gate electrode, one of the source electrode and the drain electrode being connected to the corresponding one of the plurality of source lines, and an other of the source electrode and the drain electrode being connected to the source short-circuit line; and a separating thin film transistor capable of separating an electric potential of the gate short-circuit line from an electric potential of the source short-circuit line, the separating thin film transistor having a source electrode, a drain electrode, and a gate electrode, one of the source electrode and the drain electrode being connected to the gate short-circuit line, an other of the source electrode and the drain electrode being connected to the source short-circuit line, and the gate electrode being connected to the gate electrode of each of the plurality of source line thin film transistors, wherein the plurality of gate line thin film transistors and the plurality of source line thin film transistors are of depletion-mode, and the gate electrode of each of the plurality of source line thin film transistors is connected to the gate short-circuit line.

3. The active matrix substrate according to claim 2, wherein the electric potential of the gate short-circuit line is set to a same electric potential as the electric potential of the source short-circuit line when no scanning signal voltage is supplied to the plurality of gate lines, and the electric potential of the gate short-circuit line is set to an electric potential separate from the electric potential of the source short-circuit line when a scanning signal voltage is supplied to the plurality of gate lines.

4. A testing method of a display panel, that includes an active matrix display and light-emitting pixels, the active matrix substrate, comprising:
  a substrate;
  a plurality of gate lines arranged on the substrate:
  a plurality of source lines arranged on the substrate, in a direction orthogonal to each of the plurality of gate lines;
  a gate short-circuit line arranged on a peripheral region of the substrate to short-circuit the plurality of gate lines;
  a source short-circuit line arranged on a peripheral region of the substrate to short-circuit the plurality of source lines;
  a plurality of gate line thin film transistors each provided for a corresponding one of the plurality of gate lines and each having a source electrode and a drain electrode, one of the source electrode and the drain electrode being connected to the corresponding one of the plurality of gate lines, and an other of the source electrode and the drain electrode being connected to the gate short-circuit line; and
  a plurality of source line thin film transistors each provided for a corresponding one of the plurality of source lines and each having a source electrode a drain electrode and a gate electrode, one of the source electrode and the drain electrode being connected to the corresponding one of the plurality of source lines, and an other of the source electrode and the drain electrode being connected to the source short-circuit line, the plurality of gate line thin film transistors and the plurality of source line thin film transistors being of depletion-mode, the gate electrode of each of the plurality of source line thin film transistors being connected to the gate short-circuit line, the light-emitting pixels being arranged at intersections of the plurality of gate lines and the plurality of source lines in the active matrix substrate, and the testing method comprising:
  attempting to operate a circuit of the light-emitting pixels by applying a negative voltage to the gate electrode of each of the plurality of source line thin film transistors from the gate short-circuit line to set the plurality of source line thin film transistors to a non-conducting state; and
  testing a circuit element of each of the light-emitting pixels based on a result of the circuit operation attempted in the attempting.

5. The testing method of the display panel according to claim 4, wherein circuit elements of the light-emitting pixels connected to the plurality of source lines and the plurality of gate lines are protected from static electricity by conducting the plurality of source line thin film transistors and the plurality of gate line thin film transistors by applying zero or positive voltage to the gate electrode of each of the plurality of source line thin film transistors and a gate electrode of each of the plurality of gate line thin film transistors.

* * * * *